(12) United States Patent
Choi

(10) Patent No.: US 12,411,187 B2
(45) Date of Patent: Sep. 9, 2025

(54) CONNECTION DIAGNOSIS DEVICE

(71) Applicant: SAMSUNG SDI CO., LTD., Yongin-si (KR)

(72) Inventor: Sunho Choi, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 165 days.

(21) Appl. No.: 18/001,860

(22) PCT Filed: Oct. 15, 2021

(86) PCT No.: PCT/KR2021/014313
§ 371 (c)(1),
(2) Date: Dec. 14, 2022

(87) PCT Pub. No.: WO2022/080920
PCT Pub. Date: Apr. 21, 2022

(65) Prior Publication Data
US 2023/0251330 A1  Aug. 10, 2023

(30) Foreign Application Priority Data
Oct. 16, 2020  (KR) .................. 10-2020-0134473

(51) Int. Cl.
*G01R 31/66* (2020.01)
*G01R 1/20* (2006.01)

(52) U.S. Cl.
CPC ............ *G01R 31/66* (2020.01); *G01R 1/203* (2013.01)

(58) Field of Classification Search
CPC ........ G01R 1/203; G01R 31/52; G01R 31/54; G01R 31/66; G01R 1/00; G01R 3/00;
(Continued)

(56) References Cited

U.S. PATENT DOCUMENTS 3,891,867 A  6/1975  Watanabe
5,789,902 A  8/1998  Abe et al.
(Continued)

FOREIGN PATENT DOCUMENTS

CN  105555581 A  5/2016
CN  106646076 A  5/2017
(Continued)

OTHER PUBLICATIONS

International Search Report of PCT/KR2021/014313, Jan. 21, 2022, 4 pp.
(Continued)

*Primary Examiner* — Judy Nguyen
*Assistant Examiner* — Brent J Andrews
(74) *Attorney, Agent, or Firm* — Womble Bond Dickinson (US) LLP

(57) ABSTRACT

Embodiments of the present invention relates to a connection diagnosis device for diagnosing connection states between devices. The connection diagnosis device may include: an output end and an input end connected to respective ends of an interlock loop line included in one of the devices; a first voltage varying circuit for outputting a first voltage that is variable according to a first current flowing through a first current path from among a current path for transmitting a diagnosis signal to the output end and a current path between the input end and a ground; and a first impedance varying circuit disposed on the first current path and varying impedance of the first current path according to the first voltage. The first voltage varying circuit and the first impedance varying circuit are operated to maintain the first current at a constant value.

16 Claims, 4 Drawing Sheets

(58) Field of Classification Search
CPC ... G01R 5/00; G01R 7/00; G01R 9/00; G01R 11/00; G01R 13/00; G01R 15/00; G01R 17/00; G01R 19/00; G01R 21/00; G01R 22/00; G01R 23/00; G01R 25/00; G01R 27/00; G01R 29/00; G01R 31/00; G01R 33/00; G01R 35/00
See application file for complete search history.

(56) References Cited

U.S. PATENT DOCUMENTS

| | | |
|---|---|---|
| 2002/0011867 A1 | 1/2002 | Nagai et al. |
| 2009/0073624 A1 | 3/2009 | Scholer et al. |
| 2016/0214485 A1* | 7/2016 | Butzmann ............ B60L 3/0046 |
| 2017/0307674 A1 | 10/2017 | Fouedjio et al. |
| 2019/0363558 A1 | 11/2019 | Bae et al. |
| 2020/0094682 A1 | 3/2020 | Zeng et al. |

FOREIGN PATENT DOCUMENTS

| | | | |
|---|---|---|---|
| CN | 107255782 | A | 10/2017 |
| CN | 108387809 | A * | 8/2018 |
| CN | 109664841 | A | 4/2019 |
| CN | 110261712 | A | 9/2019 |
| CN | 210427772 | U | 4/2020 |
| CN | 210742399 | U | 6/2020 |
| CN | 211478502 | U | 9/2020 |
| GB | 1445363 | A | 8/1976 |
| JP | 09-289738 | A | 11/1997 |
| JP | 10-142093 | A | 5/1998 |
| JP | 6074114 | B2 | 1/2017 |
| KR | 10-2002-0008752 | A | 1/2002 |
| KR | 10-2014-0078910 | A | 6/2014 |
| KR | 10-2016-0039693 | A | 4/2016 |
| KR | 10-2019-0134215 | A | 12/2019 |
| KR | 10-2020-0069896 | A | 6/2020 |

OTHER PUBLICATIONS

Korean Notice of Allowance for KR Application No. 10-2020-0134473 dated Apr. 4, 2024, 6 pages.
Extended European Search Report issued in corresponding EP Application No. 21880567.9, dated Oct. 25, 2024, 15 pages.
Chinese Office Action for CN Application No. 202180037263.8, dated Jun. 24, 2025, 9 pages.
Zhang, J., et al., "Design of high voltage circuit safety monitoring system for pure electric vehicles", Journal of Mechanical & Electrical Engineering, Mar. 2013, 4 pages, vol. 30, No. 3.

* cited by examiner

CONNECTION DIAGNOSIS DEVICE

CROSS-REFERENCE TO RELATED APPLICATIONS

This application is a U.S. National Phase Patent Application of International Application Number PCT/KR2021/014313, filed on Oct. 15, 2021, which claims priority of Korean Patent Application Number 10-2020-0134473, filed on Oct. 16, 2020, the entire content of each of which is incorporated herein by reference.

TECHNICAL FIELD

The present disclosure relates to a connection diagnosis device. More particularly, the present invention relates to a connection diagnosis device for diagnosing a connection state of devices in a high voltage system.

BACKGROUND ART

A hazardous voltage interlock loop (HVIL) circuit diagnoses connection states between devices in a system in which connection defects between devices may generate dangerous accidents like a high voltage system. The HVIL circuit conventionally applies specific signals (e.g., DC or AC voltage signals, current signals, and frequency signals) to an interlock loop line, and verifies the signals received through the interlock loop line to thus diagnose the connection state.

When the devices are assembled, the interlock loop line is sometimes short-circuited to a battery or a ground because of misconnection of lines. When an overcurrent generated by a short circuit of the interlock loop line is supplied to the HVIL circuit, overheat may be generated and the circuit may be damaged.

Therefore, it is needed to design the HVIL circuit so as to suppress generation of heat and prevent the circuit from being damaged when the interlock loop line is short-circuited to the ground or the battery.

DISCLOSURE

The present invention has been made in an effort to provide a connection diagnosis device for minimizing generation of heat according to a short circuit and preventing circuit damages when an interlock loop line is short-circuited.

An embodiment of the present invention provides a connection diagnosis device for diagnosing connection states between devices, including: an output end and an input end connected to respective ends of an interlock loop line included in one of the devices; a first voltage varying circuit for outputting a first voltage that is variable according to a first current flowing through a first current path from among a current path for transmitting a diagnosis signal to the output end and a current path between the input end and a ground; and a first impedance varying circuit disposed on the first current path and varying impedance of the first current path according to the first voltage. The first voltage varying circuit and the first impedance varying circuit may be operated to maintain the first current at a constant value.

The first current path may be a current path between the input end and the ground. The connection diagnosis device may further include: a second voltage varying circuit for outputting a second voltage that is variable according to a second current flowing to a second current path for transmitting a diagnosis signal to the output end; and a second impedance varying circuit disposed on the second current path and varying impedance of the second current path according to the second voltage. The second voltage varying circuit and the second impedance varying circuit may be operated so that the second current maintains a constant value.

The first voltage varying circuit and the first impedance varying circuit may be operated so that the first current maintains a first value. The second voltage varying circuit and the second impedance varying circuit may be operated so that the second current maintains a second value. The first value may be different from the second value.

The first voltage varying circuit and the first impedance varying circuit may be operated so that the first current maintains the first value when the first current belongs to a first current section. The second voltage varying circuit and the second impedance varying circuit may be operated so that the second current maintains the second value when the second current belongs to a second current section. The first current section may be different from the second current section.

The second voltage varying circuit and the second impedance varying circuit may be operated so that the second current maintains the second value while the devices are normally connected.

The first voltage varying circuit and the first impedance varying circuit may be operated so that the first current maintains the first value while the interlock loop line is short-circuited to a positive electrode side of a battery. The second voltage varying circuit and the second impedance varying circuit may be operated so that the second current maintains the second value while the interlock loop line is short-circuited to the ground.

The first voltage varying circuit may include a first resistor disposed on the first current path, and a first shunt regulator element including an anode terminal and a reference terminal connected to respective ends of the first resistor, and a cathode terminal for outputting the first voltage that is variable according to the first current flowing to the first resistor. The first impedance varying circuit may include a first transistor disposed on the first current path, and including a first terminal connected to the input end, a second terminal connected to the first resistor, and a control terminal connected to a cathode terminal of the first shunt regulator element, and a second resistor connected between a node to which the diagnosis signal is input and the control terminal of the first transistor. Impedance of the first transistor may be variable according to the first voltage.

The second voltage varying circuit may include a third resistor disposed on the second current path, and a second shunt regulator element including an anode terminal and a reference terminal connected to respective ends of the third resistor, and a cathode terminal for outputting the second voltage that is variable according to the second current flowing to the third resistor. The second impedance varying circuit may include a second transistor disposed on the second current path, and including a first terminal connected to the node, a second terminal connected to the third resistor, and a control terminal connected to a cathode terminal of the second shunt regulator element, and a fourth resistor connected between the node and the control terminal of the second transistor. Impedance of the second transistor may be variable according to the second voltage. Resistance of the first resistor may be different from resistance of the third resistor.

The first current path may be a current path between the input end and the ground, and the connection diagnosis device may further include a second voltage varying circuit for outputting a second voltage that is variable according to a second current flowing to a second current path for transmitting a diagnosis signal to the output end, and a second impedance varying circuit disposed on the second current path, and varying impedance of the second current path according to the first voltage or the second voltage.

The second impedance varying circuit may adjust impedance of the second current path so that the second current maintains a first value according to the first voltage when the second current belongs to a first current section, and it may adjust impedance of the second current path so that the second current maintains a second value according to the second voltage when the second current belongs to a second current section. The first current section may be different from the second current section, and the first value may be different from the second value.

The first impedance varying circuit may adjust impedance of the first current path so that the first current maintains the first value according to the first voltage when the first current belongs to a third current section. The first current section may be different from the third current section.

The second impedance varying circuit may adjust impedance of the second current path according to the first voltage when the devices are normally connected, and it may adjust impedance of the second current path according to the second voltage when the interlock loop line is short-circuited to the ground.

The first impedance varying circuit may maintain a turn-on state when the devices are normally connected, and it may adjust impedance of the first current path according to the first voltage when the interlock loop line is short-circuited to a positive electrode side of a battery.

The first voltage varying circuit may include a first resistor disposed on the first current path, and a first shunt regulator element including an anode terminal and a reference terminal connected to respective ends of the first resistor and a cathode terminal for outputting the first voltage that is variable according to the first current flowing through the first resistor. The first impedance varying circuit may include a first transistor disposed on the first current path and including a first terminal connected to the input end, a second terminal connected to the first resistor, and a control terminal, and a second resistor connected between a cathode terminal of the first shunt regulator element and the control terminal of the first transistor. Impedance of the first transistor may be variable according to the first voltage.

The second voltage varying circuit may include a third resistor disposed on the second current path, and a second shunt regulator element including an anode terminal and a reference terminal connected to respective ends of the third resistor, and a cathode terminal for outputting the second voltage that is variable according to the second current flowing through the third resistor. The second impedance varying circuit may include a second transistor disposed on the second current path, and including a first terminal connected to the node, a second terminal connected to the third resistor, and a control terminal connected to the cathode terminal of the first shunt regulator element and the cathode terminal of the second shunt regulator element, and a fourth resistor connected between the node and the control terminal of the second transistor. Impedance of the second transistor may be variable according to the first voltage or the second voltage. Resistance of the first resistor may be different from resistance of the third resistor.

The connection diagnosis device may further include a passive element disposed on a current path between the input end and the ground, and having fixed impedance.

The connection diagnosis device may further include a diagnosis unit for diagnosing connection states of the devices and identifying a short-circuit type of the interlock loop line based on at least one of a voltage and a current applied to the interlock loop line through the output end and a voltage and a current received through the input end.

According to the embodiments of the present invention, when the short circuit is generated in the interlock loop line, the generation of heat caused by the short circuit may be minimized and the circuit damages may be prevented. Further, it is possible to identify the short-circuit types when the short circuit is generated.

MODE FOR INVENTION

Figure 1:
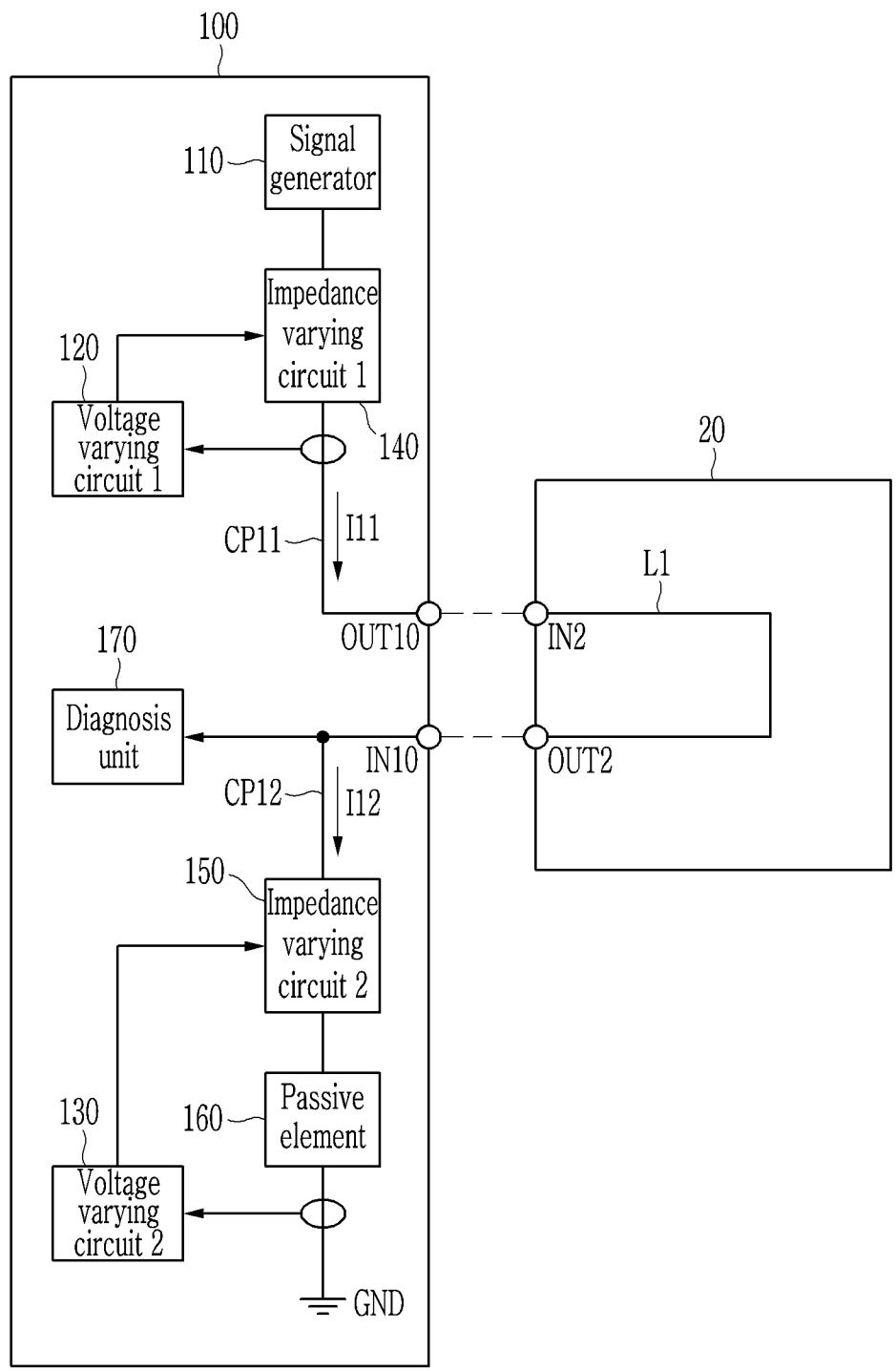
FIG. 1 shows a connection diagnosis device according to an embodiment of the present invention.

Embodiments of the present invention will now be described in detail with accompanying drawings. Effects and characteristics of embodiments, and a realization method thereof, will now be described in detail with accompanying drawings. In the drawings, same reference numerals indicate same constituent elements, and no repeated descriptions thereof will be provided. As those skilled in the art would realize, the described embodiments may be modified in various different ways, all without departing from the spirit or scope of the present invention. The embodiments are provided as examples so that the present disclosure may be thorough and complete, and will sufficiently supply aspects and characteristics of the present invention to a person skilled in the art.

Hence, for the purpose of complete understanding on the aspects and the characteristics of the present invention, processes, factors, and skills that may not be needed to a person of ordinary skill in the art may not be described. In the drawings, relative sizes of elements, layers, and regions may be exaggerated for clarity.

In the present specification, the term "and/or" includes all or random combinations of a plurality of items that are related and arranged. When the embodiments of the present invention are described, the use of "may" signifies "at least one embodiment of the present invention". Regarding the description on an embodiment of the present invention, a singular term may include a plural form unless stated in another way.

Terms including ordinal numbers such as first, second, and the like will be used only to describe various components, and are not to be interpreted as limiting these components. The terms are only used to differentiate one component from other components. For example, a first constituent element could be termed a second constituent element, and similarly, a second constituent element could be termed a first constituent element, without departing from the scope of the present invention.

In describing the embodiments, the expression "connection" means electrical connection. Electric connection of two constituent elements includes not only a case where the two constituent elements are directly connected, but also a case where the two constituent elements are connected through another constituent element interposed therebetween. Other constituent elements may include a switch, a resistor, a capacitor, and the like.

A connection diagnosis device according to embodiments of the present invention will now be described with reference to accompanying drawings.

FIG. 1 shows a connection diagnosis device according to an embodiment of the present invention.

Referring to FIG. 1, the connection diagnosis device 100 according to an embodiment of the present invention may include a signal generator 110, a plurality of voltage varying circuits 120 and 130, a plurality of impedance varying circuits 140 and 150, a passive element 160, and a diagnosis unit 170.

The signal generator 110 may generate a diagnosis signal applied to an interlock loop line L1 in a device 20 so as to diagnose the connection state of the device 20. The diagnosis signal may be a voltage signal or a current signal. The diagnosis signal may also be a square-wave signal with a specific frequency. The connection state of the device 20 may signify that the device 20 is connected to another device (e.g., a connector, a battery pack cover, etc.). The connection diagnosis device 100 may be included in another device combined to the device 20, or may be provided as an additional device.

The voltage varying circuit 120 may output a varied output voltage according to a current I11 flowing through a current path CP11 for transmitting the diagnosis signal to the interlock loop line L1, that is, the current path CP11 between the signal generator 110 and an output end OUT10 of the connection diagnosis device 100.

The voltage varying circuit 130 may output a varied output voltage according to a current I12 flowing through a current path CP12 on which the signal input from the interlock loop line L1 is transmitted, that is, the current path CP12 between an input end IN10 of the connection diagnosis device 100 and the ground GND.

The impedance varying circuit 140 may be positioned on the current path CP11 and may configure part of the current path CP11. The impedance varying circuit 140 may vary impedance of the current path CP11 according to an output voltage of the voltage varying circuit 120.

The impedance varying circuit 150 may be positioned on the current path CP12 and may configure part of the current path CP12. The impedance varying circuit 150 may vary impedance of the current path CP12 according to an output voltage of the voltage varying circuit 130.

The voltage varying circuit 120 and the impedance varying circuit 140 constant-current-control the current I11 flowing through the current path CP11, and may be operated to maintain a value of the current I11 flowing through the current path CP11. For example, when the current I11 flowing through the current path CP11 becomes greater than a setting value IA1, the voltage varying circuit 120 adjusts an output voltage, and the impedance varying circuit 140 increases the impedance of the current path CP11 according to the adjusted output voltage of the voltage varying circuit 120 so the current I11 flowing through the current path CP11 may be returned to the setting value IA1.

The voltage varying circuit 130 and the impedance varying circuit 150 constant-current-control the current I12 flowing through the current path CP12, and may be operated to maintain a value of the current I12 flowing through the current path CP12. For example, when the current I12 flowing through the current path CP12 becomes greater than a setting value IB1, the voltage varying circuit 130 adjusts an output voltage, and the impedance varying circuit 150 increases the impedance of the current path CP12 according to the adjusted output voltage of the voltage varying circuit 130 so the current I12 flowing through the current path CP12 may be returned to the setting value IB1.

When the device 20 is normally connected, the output end OUT10 and the input end IN10 of the connection diagnosis device 100 may be electrically connected to an input end IN2 and an output end OUT2 of the interlock loop line L1 in the device 20. In this state, the diagnosis signal generated by the signal generator 110 is applied to the interlock loop line L1 through the current path CP11 and the output end OUT10, and is input to the input end IN10 of the connection diagnosis device 100 through the interlock loop line L1 so it may be transmitted through the current path CP12. The signal generator 110 may generate a diagnosis signal by using a voltage supplied from a battery (not shown). In this case, a voltage level of the diagnosis signal generated by the signal generator 110 may be varied according to an output voltage of a battery (not shown).

When the voltage level of the diagnosis signal is increased to be greater than a predetermined voltage or is reduced to be less than the same while the device 20 is normally connected, the size of the currents I11 and I12 flowing through the current path CP11, the interlock loop line L1, and the current path CP12 may be changed. As described, when the size of the current flowing through the interlock loop line L1 is changed according to a variation of the voltage level of the diagnosis signal while the device 20 is normally connected, the interlock loop line L1 may be constant-current-controlled by the above-noted voltage varying circuit 120 and the impedance varying circuit 140, or the voltage varying circuit 130 and the impedance varying circuit 150.

The passive element 160 may be positioned on the current path CP12 and may configure part of the current path CP12. The passive element 160 may maintain the voltage of the interlock loop line L1 to be a constant voltage while the device 20 is normally connected.

According to what is described in the above, while the device 20 is normally connected, the current flowing to the interlock loop line L1 may be maintained to be a constant current by operation of the impedance varying circuit 140 and the voltage varying circuit 120, or the impedance varying circuit 150 and the voltage varying circuit 130. As the interlock loop line L1 maintains to be a constant current as described, the current flowing through the passive element 160 is maintained at a constant value, and the voltage of the interlock loop line L1 may be controlled in a constant voltage state by the fixed impedance of the passive element 160.

To avoid an unstable operation, the impedance varying circuit 140 and the voltage varying circuit 120 may be configured to perform an impedance adjusting operation in a current section that is different from the impedance varying circuit 150 and the voltage varying circuit 130. For example, the voltage varying circuit 120 and the impedance varying circuit 140 may be compared with the voltage varying circuit 130 and the impedance varying circuit 150, and may control the constant current by adjusting the impedance of the current path CP11 in a lower current section (e.g., a current section that may be generated when the device 20 is normally connected). in this case, the voltage varying circuit 130 and the impedance varying circuit 150 may be compared with the voltage varying circuit 120 and the impedance varying circuit 140, and may control the constant current by adjusting the impedance of the current path CP12 in a higher current section (e.g., an overcurrent section generated by a short circuit). The current value IA1 constant-current-controlled by the voltage varying circuit 120 and the impedance varying circuit 140 may be less than the current value IB1 constant-current-controlled by the voltage varying circuit 130 and the impedance varying circuit 150.

When the device 20 is assembled, the interlock loop line L1 may be short-circuited to the ground or the battery (not shown) because of misconnection of lines. The short-circuit may generate an overcurrent, and when the overcurrent flows to the connection diagnosis device 100, excessive heat may be generated or the circuit may be damaged. Therefore, to minimize the generation of heat according to the short-circuit and prevent the circuit from being damaged, the connection diagnosis device 100 may control currents of the current paths CP11 and CP12 with the predetermined values IA1 and IB1 through the voltage varying circuit 120 and the impedance varying circuit 140, or the voltage varying circuit 130 and the impedance varying circuit 150.

When the interlock loop line L1 is short-circuited to the ground, a short-circuit current that is greater than the setting value IA1 flows to the current path CP11. In this case, the voltage varying circuit 120 may adjust the output voltage corresponding to the short-circuit current, and the impedance varying circuit 140 may increase the impedance of the current path CP11 according to the adjusted output voltage of the voltage varying circuit 120 to thus constant-current-control the current I11 flowing through the current path CP11 with the setting value IA1.

When the interlock loop line L1 is short-circuited to a positive electrode of the battery (not shown), the greater short-circuit current than the setting value IB1 flows to the current path CP12. In this case, the voltage varying circuit 130 may adjust the output voltage corresponding to the short-circuit current, and the impedance varying circuit 150 may increase the impedance of the current path CP12 according to the adjusted output voltage of the voltage varying circuit 130 to thus constant-current-control the current I12 flowing to the current path CP12 with the setting value IB1.

The diagnosis unit 170 may be electrically connected to the input end IN10, may measure the voltage and the current input through the input end IN10, and may diagnose the connection state of the device 20.

According to what is described in the above, when the device 20 is normally fastened, the current input to the input end IN10 through the interlock loop line L1 while the diagnosis signal is applied is constant-current-controlled with a predetermined value (e.g., IA1), and the voltage of the interlock loop line L1 measured through the input end IN10 is constant-voltage-controlled to thus maintain a constant value. Therefore, the diagnosis unit 170 may identify the device 20 to be normally connected when the voltage input through the input end IN10 is a value that is set by a constant-voltage-control or when the current input through the input end IN10 is a value (e.g., IA1) that is set by a constant-current-control.

The diagnosis unit 170 may identify a malfunction type when the connection state of the device 20 is determined to be bad.

When the connection of the device 20 is in an opened state, the electrical connection between the output end OUT10 or the input end IN10 of the connection diagnosis device 100 and the interlock loop line L1 of the device 20 may be disconnected. When the voltage and the current at the input end IN10 are measured in this state, the voltage at the input end IN10 may be measured to be a ground voltage or a limited voltage and the current input through the input end IN10 may be measured to be 0 even when the diagnosis signal is applied.

When the interlock loop line L1 is short-circuited to the ground, the input end IN10 and the output end OUT10 may be connected to the ground. When the voltage and the current at the input end IN10 and the output end OUT10 are measured, the voltages at the input end IN10 and the output end OUT10 may be measured to be the ground voltage while the diagnosis signal is applied. Further, the current input from the interlock loop line L1 through the input end IN10 while applying the diagnosis signal is 0, and the current applied to the interlock loop line L1 through the output end OUT10 may be measured to be the value IA1 that is set by the constant-current-control of the voltage varying circuit 120 and the impedance varying circuit 140.

When the interlock loop line L1 is short-circuited to the side of the positive electrode of the battery, the input end IN10 and the output end OUT10 may be connected to the side of the positive electrode of the battery. When the voltage and the current at the input end IN10 and the output end OUT10 are measured, the voltages at the input end IN10 and the output end OUT10 while applying the diagnosis signal may be measured to be a voltage that is similar to the output voltage of the battery. The current input from the interlock loop line L1 through the input end IN10 while applying the diagnosis signal is the value IB1 that is set by the constant-current-control of the voltage varying circuit 130 and the impedance varying circuit 150, and the current flowing through the output end OUT10 may be 0.

Hence, the diagnosis unit 170 may measure the voltage and the current input from the interlock loop line L1 through the input end IN10 while applying the diagnosis signal or the voltage and the current output to the interlock loop line L1 through the output end OUT10, and may identify defect types into opened, ground short circuit, and battery short circuit based on the measured values.

Figure 2:
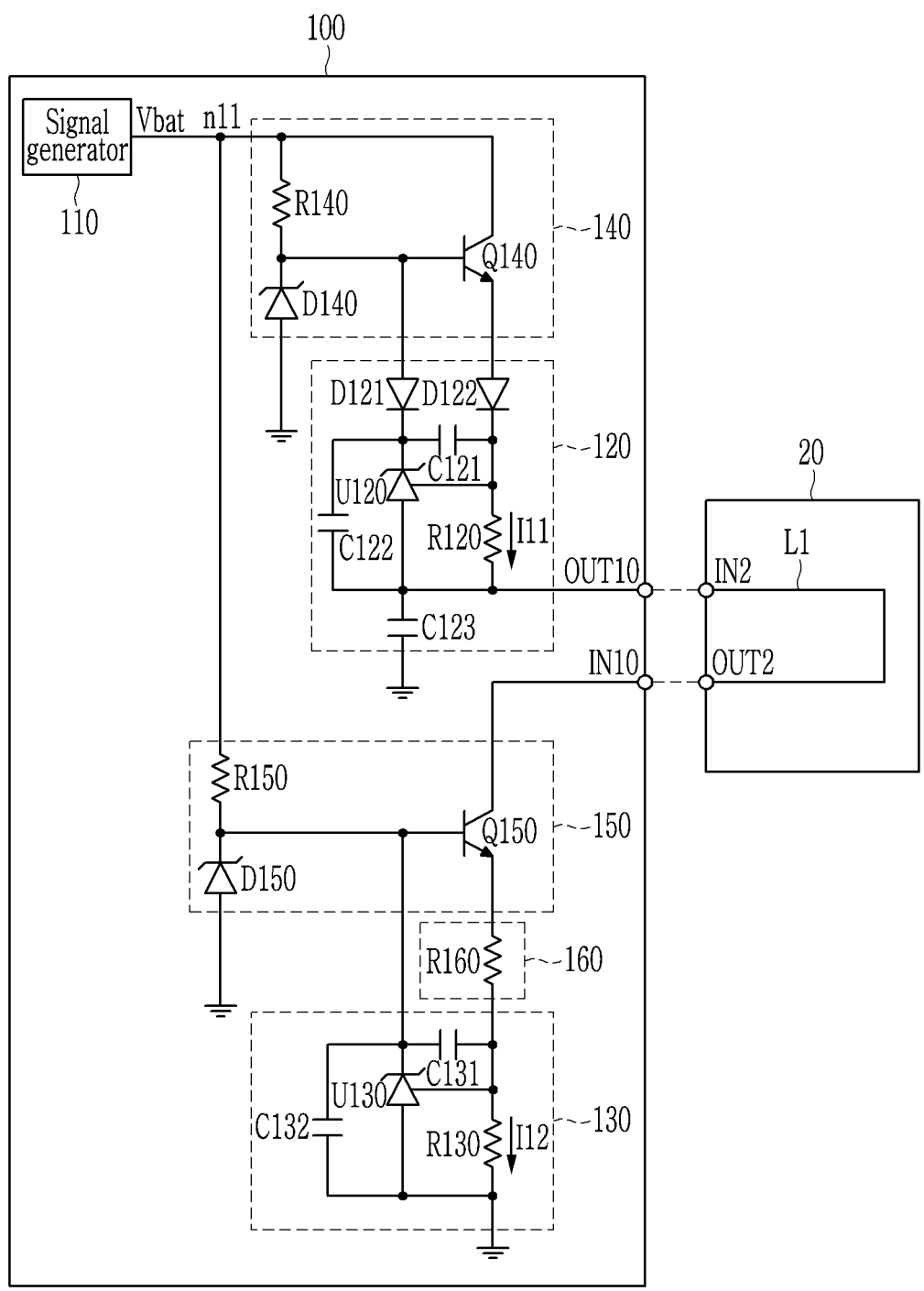
FIG. 2 shows an example of a circuit configuration of a connection diagnosis device according to an embodiment of the present invention.

FIG. 2 shows an example of a circuit configuration of a connection diagnosis device 100 of FIG. 1.

Referring to FIG. 2, the signal generator 110 generates a diagnosis signal Vbat by using the output voltage of the battery (not shown), and the diagnosis signal Vbat may be a voltage signal that has an output voltage level of the battery.

The voltage varying circuit 120 is configured with a shunt regulator circuit, and may include a shunt regulator element U120 and a resistor R120. The shunt regulator element U120 may include an anode terminal, a cathode terminal, and a reference terminal. A resistor R120 may be connected between the anode terminal and the reference terminal of the shunt regulator element U120, and the cathode terminal of the shunt regulator element U120 may be connected to a control terminal of a transistor Q140 configuring the impedance varying circuit 140. The resistor R120 is positioned on the current path CP11 for transmitting the diagnosis signal Vbat applied by the signal generator 110 to the output terminal OUT10, and respective terminals may be connected to the anode terminal and the reference terminal of the shunt regulator element U120.

The shunt regulator element U120 may be operated to vary the output voltage output to the cathode terminal according to the current I11 flowing through the resistor R120. For example, the shunt regulator element U120 may be operated to increase the voltage at the cathode terminal when the current I11 flowing through the resistor R120 becomes greater than the setting value IA1.

The voltage at the cathode terminal of the shunt regulator element U120 that is variable according to the current I11 flowing through the resistor R120 is transmitted to a control terminal of the transistor Q140 configuring the impedance varying circuit 140, and may be used to determine impedance of the transistor Q140.

The voltage varying circuit 120 may further include at least one of capacitors C121, C122, and C123 so as to remove ripples from the voltage output to the cathode terminal of the shunt regulator element U120 and remove noise. For example, to remove ripples from the output voltage, the capacitor C121 may be connected between the cathode terminal and the reference terminal of the shunt regulator element U120, and the capacitor C122 may be connected between the cathode terminal and the anode terminal of the shunt regulator element U120. For another example, a capacitor C123 for removing noise may be connected between the anode terminal of the shunt regulator element U120 and the ground.

The voltage varying circuit 120 may further include at least one of diodes D121 and D122 so as to prevent a reversal of current toward the impedance varying circuit 140. The diode D121 includes a cathode terminal connected to the cathode terminal of the shunt regulator element U120, and an anode terminal connected to the control terminal of the transistor Q140, and may prevent the current from flowing to the control terminal of the transistor Q140 from the cathode terminal of the shunt regulator element U120. The diode D122 includes a cathode terminal connected to the resistor R120, and an anode terminal connected to the output terminal of the transistor Q140, and may prevent the current from flowing to the output terminal of the transistor Q140 from the resistor R120.

The impedance varying circuit 140 may include a transistor Q140 and a resistor R140. The transistor Q140 is positioned on the current path CP11, and may include an input terminal, an output terminal, and a control terminal. The input terminal of the transistor Q140 may be connected to a node n11 to which the diagnosis signal Vbat is applied by the signal generator 110, and the output terminal of the transistor Q140 may be connected to the resistor R120 of the voltage varying circuit 120. The control terminal of the transistor Q140 may be connected to the cathode terminal of the shunt regulator element U120 configuring the voltage varying circuit 120. The resistor R140 may be connected between the node n11 to which the diagnosis signal Vbat is applied by the signal generator 110 and the control terminal of the transistor Q140.

Impedance of the transistor Q140 may be variable according to the voltage input to the control terminal. The transistor Q140 configures part of the current path CP11 so the change of the impedance of the transistor Q140 may lead to a change of impedance of the current path CP11.

For example, with reference to FIG. 2, the transistor Q140 may be configured with an NPN transistor. In this case, the input terminal, the output terminal, and the control terminal of the transistor Q140 may respectively be a collector terminal, an emitter terminal, and a base terminal. The impedance of the NPN transistor Q140 may increase as the current input to the base terminal is reduced. When the voltage at the cathode terminal of the shunt regulator element U120 configuring the voltage varying circuit 120 increases, the voltage between respective ends of the resistor R140 is reduced, and the current input to the base of the NPN transistor Q140 through the resistor R140 is reduced. Therefore, the NPN transistor Q140 may be operated so that the impedance thereof may increase as the voltage at the cathode terminal of the shunt regulator element U120 increases, and the impedance may be reduced as the voltage at the cathode terminal of the shunt regulator element U120 is reduced.

The transistor Q140 may be substituted with other types of transistors, not the NPN transistor.

The impedance varying circuit 140 may further include a Zener diode D140 connected between the control terminal of the transistor Q140 and the ground so as to control the voltage applied to the control terminal of the transistor Q140.

The voltage varying circuit 130 is configured with a shunt regulator circuit, and may include a shunt regulator element U130 and a resistor R130. The shunt regulator element U130 may include an anode terminal, a cathode terminal, and a reference terminal. A resistor R130 may be connected between the anode terminal and the reference terminal of the shunt regulator element U120, and the cathode terminal of the shunt regulator element U130 may be connected to the control terminal of the transistor Q150 configuring the impedance varying circuit 150. The resistor R130 may be positioned on the current path CP12 connected between the input end IN10 and the ground, and respective terminals may be connected to the anode terminal and the reference terminal of the shunt regulator element U130.

The shunt regulator element U130 may be operated to vary the output voltage that is output to the cathode terminal according to the current I12 flowing to the resistor R130. For example, the shunt regulator element U130 may be operated to increase the voltage at the cathode terminal when the current I12 flowing through the resistor R130 becomes greater than the setting value IB1.

The voltage at the cathode terminal of the shunt regulator element U130 that is variable according to the current I12 flowing through the resistor R130 may be transmitted to the control terminal of the transistor Q150 configuring the impedance varying circuit 150, and may be used to determine the impedance of the transistor Q150.

The voltage varying circuit 130 may further include at least one of the capacitors C131 and C132 so as to remove ripples from the voltage output to the cathode terminal of the shunt regulator element U130. For example, to remove ripples from the output voltage, the capacitor C131 may be connected between the cathode terminal and the reference terminal of the shunt regulator element U130, and the capacitor C132 may be connected between the cathode terminal and the anode terminal of the shunt regulator element U130.

The impedance varying circuit 150 may include a transistor Q150 and a resistor R150. The transistor Q150 may be positioned on the current path CP12, and may include an input terminal, an output terminal, and a control terminal. The input terminal of the transistor Q150 may be connected to the input end IN10, and the output terminal of the transistor Q150 may be connected to the resistor R130 of the voltage varying circuit 130 through the passive element 160. The control terminal of the transistor Q150 may be connected to the cathode terminal of the shunt regulator element U130 configuring the voltage varying circuit 130. The resistor R150 may be connected between the node n11 to which the diagnosis signal Vbat is applied by the signal generator 110 and the control terminal of the transistor Q150.

The impedance of the transistor Q150 may be variable according to the voltage input to the control terminal. The transistor Q150 configures part of the current path CP12 so the change of impedance of the transistor Q150 may lead to a change of impedance of the current path CP12.

For example with reference to FIG. 2, the transistor Q150 may be configured with an NPN transistor. In this case, the input terminal and the output terminal of the transistor Q150 may be a collector terminal and an emitter terminal, and the control terminal of the transistor Q140 may be a base terminal. The impedance of the NPN transistor Q150 may increase when the current input to the base terminal is reduced. When the voltage at the cathode terminal of the shunt regulator element U130 configuring the voltage varying circuit 130 increases, the voltage at respective ends of the resistor R150 is reduced, and the current input to the base of the NPN transistor Q150 through the resistor R150 is reduced. Hence, the NPN transistor Q150 may be operated so that the impedance thereof may increase as the voltage at the cathode terminal of the shunt regulator element U130 increases and the impedance may be reduced as the voltage at the cathode terminal of the shunt regulator element U130 is reduced.

The transistor Q150 may be substituted with other types of transistor, not the NPN transistor.

The impedance varying circuit 150 may further include a Zener diode D150 connected between the control terminal of the transistor Q150 and the ground so as to control the voltage applied to the control terminal of the transistor Q150.

The passive element 160 may include a resistor R160 positioned on the current path CP12. FIG. 2 exemplifies that the passive element 160 is positioned between the voltage varying circuit 130 and the impedance varying circuit 150, and the position of the passive element 160 may be changed. For example, the passive element 160 may be disposed between the input end IN10 and the transistor Q150 configuring the impedance varying circuit 150. For example, the passive element 160 may be disposed between the resistor R130 configuring the voltage varying circuit 130 and the ground.

According to what is described in the above, one of the impedance varying circuits 140 and 150 may perform an impedance adjusting function in the normal connection state and the overcurrent state, and the other thereof may perform an impedance adjusting function in the overcurrent state. That is, one of the transistors Q140 and Q150 configuring the impedance varying circuits 140 and 150 may be operated so that its impedance may be adjusted in the normal connection state and the overcurrent state, and the other may be operated so that its impedance may be adjusted in the overcurrent state. For this purpose, resistance of the resistor R120 of the voltage varying circuit 120 may be set to be different from resistance of the resistor R130 of the voltage varying circuit 130. For example, resistance of the resistor R120 may be set to be greater than resistance of the resistor R130.

In the normal connection state of the device 20, the transistor (e.g., transistor Q150) not performing an impedance adjusting operation may maintain a turn-on state in which it has constant impedance.

Figure 3:
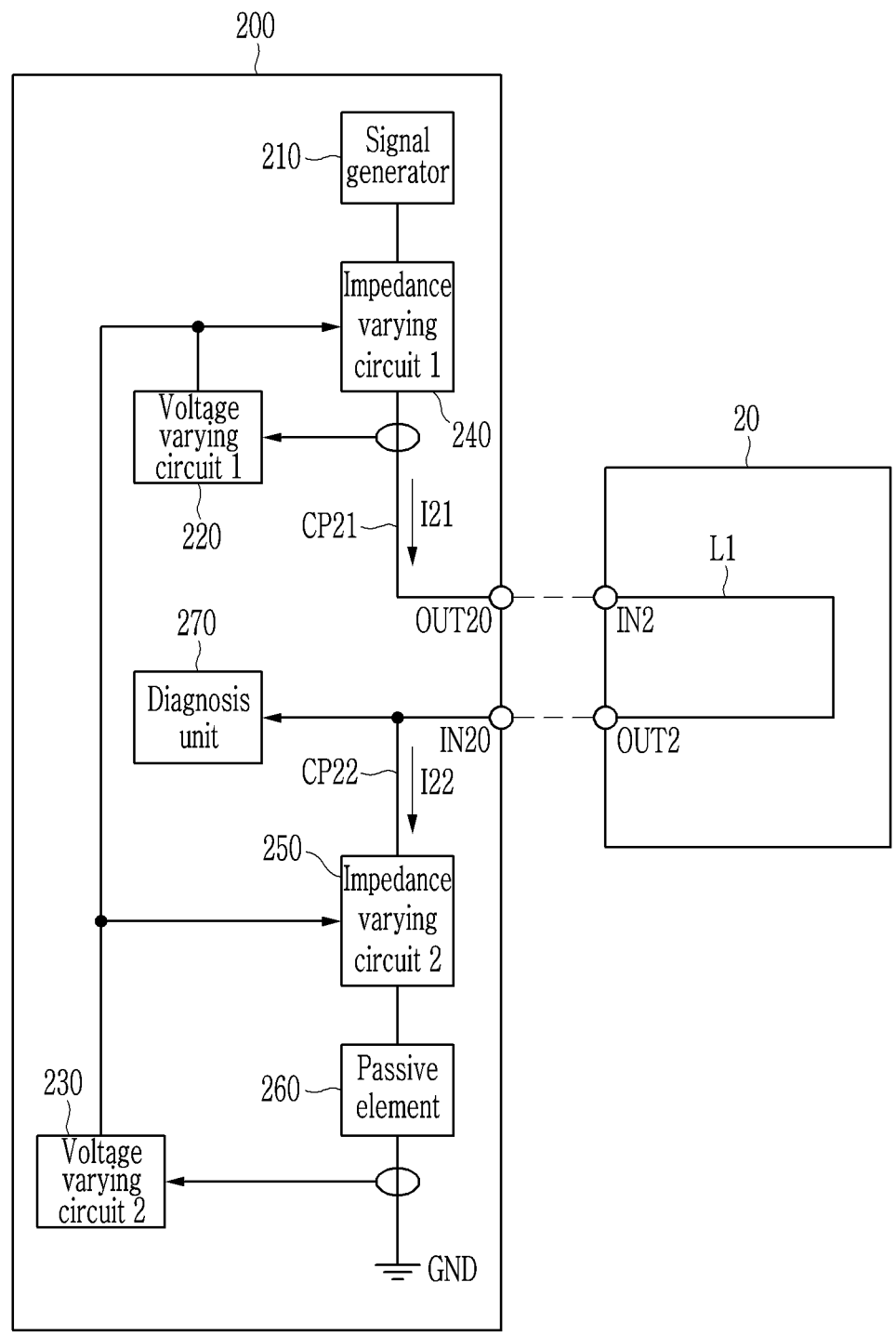
FIG. 3 shows a connection diagnosis device according to another embodiment of the present invention.

FIG. 3 shows a connection diagnosis device according to another embodiment of the present invention.

Referring to FIG. 3, the connection diagnosis device 200 according to another embodiment of the present invention may include a signal generator 210, a plurality of voltage varying circuits 220 and 230, a plurality of impedance varying circuits 240 and 250, a passive element 260, and a diagnosis unit 270.

The signal generator 210 may generate a diagnosis signal applied to the interlock loop line L1 in the device 20 so as to diagnose the connection of the device 20. The diagnosis signal may be a voltage signal or a current signal. The diagnosis signal may also be a pulse signal with a specific pattern.

The voltage varying circuit 220 may output the output voltage that is variable according to the current I21 flowing through the current path CP21 for transmitting the diagnosis signal to the interlock loop line L1, that is, the current path CP21 between the signal generator 210 and the output end OUT20 of the connection diagnosis device 200.

The voltage varying circuit 230 may output the output voltage that is variable according to the current I22 flowing through the current path CP22 on which the signal input from the interlock loop line L1 is transmitted, that is, the current path CP22 between the input end IN20 of the connection diagnosis device 200 and the ground GND.

The impedance varying circuit 240 is positioned on the current path CP21 and configures part of the current path CP21, and may vary the impedance of the current path CP21 according to the output voltage of the voltage varying circuit 220 or the output voltage of the voltage varying circuit 230.

The impedance varying circuit 250 is positioned on the current path CP22 to configure part of the current path CP22, and may vary the impedance of the current path CP22 according to the output voltage of the voltage varying circuit 230.

The voltage varying circuit 230 may, while the device 20 is normally connected, control the impedance varying circuit 240 so that the currents I21 and I22 may maintain constant values flowing through the current paths CP21 and CP22. For example, when the current I22 flowing through the current path CP22 becomes greater than a predetermined value IB2 while the device 20 is normally connected, the voltage varying circuit 230 adjusts the output voltage, and the impedance varying circuit 240 increases the impedance of the current path CP21 according to the adjusted output voltage of the voltage varying circuit 230 to thus return the currents I21 and I22 flowing through the current paths CP21 and CP22 to the predetermined value IB2.

The voltage varying circuit 220 may control the impedance varying circuit 240 so that the current I21 flowing through the current path CP21 may be maintained at a constant value while the interlock loop line L1 is short-circuited to the ground. When the interlock loop line L1 is short-circuited to the ground and the short-circuit current that is greater than a predetermined value IA2 flows through the current path CP21, the voltage varying circuit 220 may adjust the output voltage according to the short-circuit current, and the impedance varying circuit 240 may increase the impedance of the current path CP21 according to the adjusted output voltage of the voltage varying circuit 220 to thus return the current I21 flowing through the current path CP21 to a predetermined value IA2.

As described above, the impedance varying circuit 240 may be operated to receive the output voltages of the voltage varying circuit 220 and the voltage varying circuit 230, vary the impedance of the current path CP21 according to the output voltage of the voltage varying circuit 230 in the normal connection state, and vary the impedance of the current path CP21 according to the output voltage of the voltage varying circuit 220 in the ground short-circuit state. Therefore, the impedance varying circuit 240 may adjust the impedance of the current path CP21 so that the currents I21 and I22 flowing through the current paths CP21 and CP22 may maintain the setting value IB2 in the normal connection state, and it may adjust the impedance of the current path CP21 so that the current I21 flowing through the current path CP21 may maintain the setting value IA2 in the ground short-circuit state. The setting value IA2 may be greater than the setting value IB2.

The voltage varying circuit 230 may control the impedance varying circuit 250 so that the current I22 flowing through the current path CP22 may maintain a constant value while the interlock loop line L1 is short-circuited to the positive electrode side of the battery (not shown). When the interlock loop line L1 is short-circuited to the positive electrode side of the battery and the short-circuit current that is greater than the setting value IB2 flows through the current path CP22, the voltage varying circuit 230 may adjust the output voltage according to the short-circuit current, and the impedance varying circuit 250 may increase the impedance of the current path CP22 according to the adjusted output voltage of the voltage varying circuit 230 to thus return the current I22 flowing through the current path CP22 to the setting value IB2.

The passive element 260 is positioned on the current path CP22, and may maintain the voltage of the interlock loop line L1 while the device 20 is normally connected. According to what is described in the above, while the device 20 is normally connected, the current flowing to the interlock loop line L1 may be maintained to be in the constant current state according to the operations of the impedance varying circuit 240 and the voltage varying circuit 220, or the impedance varying circuit 240 and the voltage varying circuit 230. As described above, as the interlock loop line L1 maintains the constant current state, the current flowing through the passive element 260 may be maintained, and the voltage of the interlock loop line L1 may be controlled to be the constant voltage by the fixed impedance of the passive element 260.

The diagnosis unit 270 may be electrically connected to the input end IN20 to measure the voltage and the current input through the input end IN20, and may diagnose the connection state of the device 20 based on the measured results.

When the device 20 is normally fastened, and while the diagnosis signal is applied, the current input to the input end IN20 through the interlock loop line L1 is constant-current-controlled with the setting value IB2, and the voltage of the interlock loop line L1 measured through the input end IN20 is constant-voltage-controlled to maintain a predetermined value. Therefore, when the voltage input through the input end IN20 is a value set by the constant-voltage control and the current input through the input end IN20 is a value IB2 set by the constant-current control, the diagnosis unit 270 may identify that the device 20 is normally connected.

When the connection state of the device 20 is determined to be a defect, the diagnosis unit 270 may identify a defect type.

When the voltage and the current of the input end IN20 are measured while the connection of the device 20 is opened, and the diagnosis signal is then applied, the voltage of the input end IN20 may be measured to be a ground voltage or a limit voltage, and the current input through the input end IN20 may be measured to be 0.

When the voltage and the current on the input end IN20 and the output end OUT20 are measured while the interlock loop line L1 is short-circuited to the ground, the voltages at the input end IN20 and the output end OUT20 while the diagnosis signal is applied may be measured to be a ground voltage. The current input from the interlock loop line L1 through the input end IN20 while the diagnosis signal is applied is 0, and the current applied to the interlock loop line L1 through the output end OUT20 may be measured as the value IA2 set by the constant-current control of the voltage varying circuit 220 and the impedance varying circuit 240.

When the interlock loop line L1 is short-circuited to the positive electrode side of the battery, the input end IN20 and the output end OUT20 may be connected to the positive electrode side of the battery. Hence, when the voltage and the current on the input end IN20 and the output end OUT20 are measured in this state, the voltages at the input end IN20 and the output end OUT20 while the diagnosis signal is applied may be measured to be similar to the output voltage of the battery. The current input from the interlock loop line L1 through the input end IN20 while the diagnosis signal is applied may be the value IB2 set by the constant-current control of the voltage varying circuit 230 and the impedance varying circuit 250, and the current flowing through the output end OUT20 may be 0.

Therefore, the diagnosis unit 270 may measure the voltage and the current input from the interlock loop line L1 through the input end IN20 or the voltage and the current output to the interlock loop line L1 through the output end OUT20 while the diagnosis signal is applied, and may identify the defect types as opened, ground short-circuit, and battery short-circuit based on at least one of the measured values.

Figure 4:
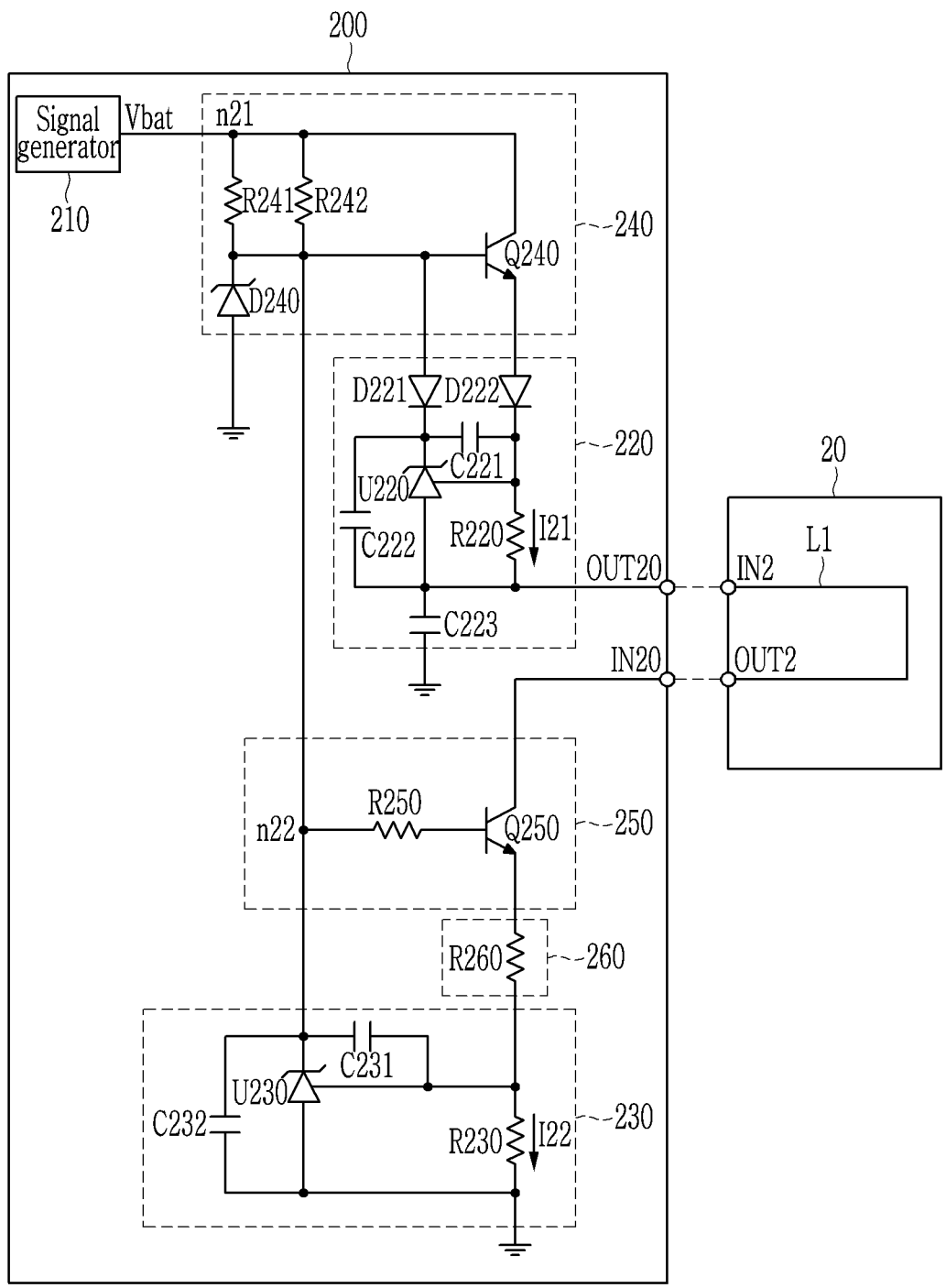
FIG. 4 shows an example of a circuit configuration of a connection diagnosis device according to another embodiment of the present invention.

FIG. 4 shows an example of a circuit configuration of a connection diagnosis device 200 of FIG. 3.

Referring to FIG. 4, the signal generator 210 generates the diagnosis signal Vbat by using the output voltage of the battery (not shown), and the diagnosis signal Vbat may be a voltage signal having an output voltage level of the battery.

The voltage varying circuit 220 is configured with a shunt regulator circuit, and may include a shunt regulator element U220 and a resistor R220. A resistor R220 is connected between the anode terminal and the reference terminal of the shunt regulator element U220, and the cathode terminal of the shunt regulator element U220 may be connected to the control terminal of the transistor Q240 configuring the impedance varying circuit 240. The resistor R220 is coupled in series to the current path CP21 for transmitting the diagnosis signal Vbat applied by the signal generator 210 to the output terminal OUT20, and respective terminals may be connected to the anode terminal and the reference terminal of the shunt regulator element U220.

The shunt regulator element U220 may be operated to vary the output voltage that is output to the cathode terminal according to the current I21 flowing to the resistor R220. The voltage at the cathode terminal of the shunt regulator element U220 may be transmitted to the control terminal of the transistor Q240 configuring the impedance varying circuit 240, and may be used to determine the impedance of the transistor Q240.

The voltage varying circuit 220 may further include at least one of capacitors C221, C222, and C223 so as to remove ripples from the voltage output to the cathode terminal of the shunt regulator element U220 and remove noise. For example, to remove ripples from the output voltage, the capacitor C221 may be connected between the cathode terminal and the reference terminal of the shunt regulator element U220, and the capacitor C222 may be connected between the cathode terminal and the anode terminal of the shunt regulator element U220. For example, the capacitor C223 for removing noise may be connected between the anode terminal of the shunt regulator element U220 and the ground.

To prevent the reversal of current toward the impedance varying circuit 240, the voltage varying circuit 220 may further include at least one of diodes D221 and D222. The diode D221 may include a cathode terminal connected to the cathode terminal of the shunt regulator element U220 and an anode terminal connected to the control terminal of the transistor Q240, and may prevent the current from flowing to the control terminal of the transistor Q240 from the cathode terminal of the shunt regulator element U220. The diode D222 may include a cathode terminal connected to the resistor R220 and an anode terminal connected to the output terminal of the transistor Q240, and may prevent the current from flowing to the output terminal of the transistor Q240 from the resistor R220.

The voltage varying circuit 230 may include a shunt regulator circuit, a shunt regulator element U230, and a resistor R230. The shunt regulator element U230 may include an anode terminal, a cathode terminal, and a reference terminal. The resistor R230 may be connected between the anode terminal and the reference terminal of the shunt regulator element U220, and the cathode terminal of the shunt regulator element U230 may be connected to the control terminal of the transistor Q250 configuring the impedance varying circuit 250. The resistor R230 may be coupled in series to the current path CP22 connected between the input end IN20 and the ground, and the respective terminals may be connected to the anode terminal and the reference terminal of the shunt regulator element U230.

The shunt regulator element U230 may be operated to vary the output voltage that is output to the cathode terminal according to the current I22 flowing to the resistor R230. The voltage at the cathode terminal of the shunt regulator element U230 that is variable according to the current I22 flowing through the resistor R230 may be transmitted to the impedance varying circuits 240 and 250, and may be used to determine the impedance of the transistors Q240 and Q250 configuring the impedance varying circuits 240 and 250.

The voltage varying circuit 230 may further include at least one of capacitors C231 and C232 so as to remove ripples from the voltage output to the cathode terminal of the shunt regulator element U230. For example, to remove ripples from the output voltage, the capacitor C231 may be connected between the cathode terminal and the reference terminal of the shunt regulator element U230, and the capacitor C232 may be connected between the cathode terminal and the anode terminal of the shunt regulator element U230.

The impedance varying circuit 240 may include a transistor Q240 and at least one of resistors R241 and R242. The transistor Q240 may be positioned on the current path CP21, and may include an input terminal, an output terminal, and a control terminal. The input terminal of the transistor Q240 may be connected to a node n11 to which the diagnosis signal Vbat is applied by the signal generator 210, and the output terminal of the transistor Q240 may be connected to the resistor R220 of the voltage varying circuit 220. The control terminal of the transistor Q240 may be connected to the cathode terminals of the shunt regulator elements U220 and U230 configuring the voltage varying circuits 220 and 230. The resistors R241 and R242 may be connected between the node n11 to which the diagnosis signal Vbat is applied by the signal generator 210 and the control terminal of the transistor Q240.

The impedance of the transistor Q240 may be variable according to the voltage input to the control terminal. The transistor Q240 configures part of the current path CP21 so the change of impedance of the transistor Q240 may lead to the change of impedance of the current path CP21.

For example with reference to FIG. 4, the transistor Q240 may be configured with an NPN transistor. In this case, the input terminal, the output terminal, and the control terminal of the transistor Q240 may respectively be a collector terminal, an emitter terminal, and a base terminal. The impedance of the NPN transistor Q240 may increase as the current input to the base terminal is reduced. When the voltage input to the control terminal of the NPN transistor Q240 increases, the voltage at respective ends of the resistors R241 and R242 is reduced, and the current input to the base of the NPN transistor Q240 through the resistors R241 and R242 is reduced. Therefore, the NPN transistor Q240 may be operated so that the impedance thereof may increase as the voltage applied to the control terminal becomes greater, and the impedance thereof may be reduced as the voltage applied to the control terminal is reduced.

The transistor Q240 may be substituted with other types of transistors, not the NPN transistor.

The impedance varying circuit 240 may further include a Zener diode D240 connected between the control terminal of the transistor Q240 and the ground so as to limit the voltage applied to the control terminal of the transistor Q240.

The impedance varying circuit 250 may include a transistor Q250 and a resistor R250. The transistor Q250 is positioned on the current path CP22, and may include an input terminal, an output terminal, and a control terminal. The input terminal of the transistor Q250 may be connected to the input end IN20, and the output terminal of the transistor Q250 may be connected to the resistor R230 of the voltage varying circuit 230 through the passive element 260. The control terminal of the transistor Q250 may be connected to the cathode terminal of the shunt regulator element U230 configuring the voltage varying circuit 230 through the resistor R250. The resistor R250 may be connected between the cathode terminal of the shunt regulator element U230 and the control terminal of the transistor Q250.

The impedance of the transistor Q250 may be variable according to the voltage at the cathode terminal of the shunt regulator element U230. As the transistor Q250 configures part of the current path CP22, the change of impedance of the transistor Q250 may lead the change of impedance of the current path CP22.

For example with reference to FIG. 4, the transistor Q250 may be configured with an NPN transistor. In this case, the input terminal and the output terminal of the transistor Q250 may be a collector terminal and an emitter terminal, and the control terminal of the transistor Q240 may be a base terminal. The impedance of the NPN transistor Q250 may increase when the current input to the base terminal is reduced. When the voltage at the cathode terminal of the shunt regulator element U230 configuring the voltage varying circuit 230 increases, the current input to the base of the NPN transistor Q250 through the resistor R250 is reduced. Hence, the NPN transistor Q250 may be operated so that the impedance thereof may increase as the voltage at the cathode terminal of the shunt regulator element U230 increases and the impedance may be reduced as the voltage at the cathode terminal of the shunt regulator element U230 is reduced.

The transistor Q250 may be substituted with other types of transistors, not the NPN transistor.

The passive element 260 may include a resistor R260 positioned on the current path CP22. FIG. 4 exemplifies that the passive element 260 is positioned between the voltage varying circuit 230 and the impedance varying circuit 250, and the position of the passive element 160 may be changed. For example, the passive element 260 may be disposed between the input end IN20 and the transistor Q250 configuring the impedance varying circuit 250. For example, the passive element 260 may be disposed between the resistor R230 configuring the voltage varying circuit 230 and the ground.

According to what is described in the above, the voltage varying circuit 230 may be operated so that it may, when the device 20 is normally connected, control the impedance varying circuit 240 to adjust the impedance of the current path CP21, and the voltage varying circuit 220 may be operated so that it may, when the interlock loop line L1 is ground-short-circuited, control the impedance varying circuit 240 to adjust the impedance of the current path CP21. That is, the voltage varying circuits 220 and 230 may control the impedance varying circuit 240 to adjust the impedance of the current path CP21 in different current sections. To achieve this, regarding the circuit configuration of FIG. 4, resistance of the resistor R220 of the voltage varying circuit 220 may be set to be different from resistance of the resistor R230 of the voltage varying circuit 230. The voltage varying circuit 220 may, while the short-circuit current flows through the current path CP21, control the impedance varying circuit 240, and the voltage varying circuit 230 may control the impedance varying circuit 240 in the normal connection state so resistance of the resistor R220 may be set to be less than resistance of the resistor R230.

According to what is described in the above, the impedance varying circuit 250 may be operated to adjust the impedance of the current path CP22 when an overcurrent flows to the current path CP22 in a battery short-circuit condition, differing from the impedance varying circuit 240 for adjusting the impedance of the current path CP21 in the normal connection state. For this operation, a resistor R250 may be connected between the cathode terminal of the shunt regulator element U230 and the control terminal of the transistor Q250. In the normal connection state of the device 20, the transistor Q250 may maintain the turn-on state having constant impedance.

The connection diagnosis devices 100 and 200 according to the above-described embodiments may, when compared to the conventional HVIL circuits, minimize generation of heat according to a short circuit when the interlock loop line L1 is short-circuited and may prevent circuit damages. In addition, the connection diagnosis devices 100 and 200 may control the interlock loop line L1 in the constant current state and the constant voltage state, and may diagnose the connection and may identify defect types when a DC voltage signal is applied as well as a pulse width modulation (PWM) signal. Particularly, as the voltage of the interlock loop line L1 is maintained at the constant voltage that is less than the output voltage of the battery in the normal state, and the voltage of the interlock loop line L1 is maintained at the output voltage of the battery in the state that the interlock loop line L1 is short-circuited to the battery, the connection diagnosis devices 100 and 200 may distinguish the normal state and the battery short-circuit state. On the contrary, when the DC voltage signal is applied to the interlock loop line in the existing HVIL circuits, the voltage of the interlock loop line in the normal state is similar to the voltage of the interlock loop line in the battery short-circuit state, so it is difficult to distinguish them, and the PWM signal is used as the diagnosis signal.

Electronic or electrical devices according to embodiments of the present invention and/or other related devices or constituent elements may be realized by using appropriate hardware, firmware (e.g., an application-specific integrated circuit), software, or combinations of software, firmware, and hardware. For example, various configurations of the above-noted devices may be positioned on one integrated circuit (IC) chip or an individual IC chip. Various configurations of the above-noted devices may be realized on a flexible printed circuit film, a tape carrier package (TCP), a printed circuit board (PCB), or one substrate. The electrical or mutual connections described in the present specification may, for example, be realized by the PCB, wires on different types of circuit carriers, or conductive elements. The conductive elements may, for example, include metallization such as surface metallization and/or pins, and may include conductive polymers or ceramics. Electrical energy may be transmitted by electromagnetic radiation or a light-using radio access.

The various configurations of the devices may be performed by at least one processor so as to perform the above-described various functions, they may be performed in at least one computing device, and they may be processes or threads for performing computer program instructions and interacting with other system constituent elements. The computer program instruction is stored in a memory realizable in a computing device using a standard memory device such as a random access memory (RAM). The computer program instruction may also be stored in a non-transitory computer readable medium such as a CD-ROM or a flash drive.

A person of ordinary skill in the art must understand that various functions of the computing device may be combined or united to a single computing device, or functions of a specific computing device may be dispersed to at least another computing device while not digressing from the range of the embodiments of the present invention.

DESCRIPTION OF SYMBOLS 100, 200: connection diagnosis device
110, 210: signal generator
120, 130, 220, 230: voltage varying circuit
140, 150, 240, 250: impedance varying circuit
160, 260: passive element
170, 270: diagnosis unit
CP11, CP12, CP21, CP22: current path
IN10, IN20: input end
OUT10, OUT20: output end

The invention claimed is:
1. A connection diagnosis device for diagnosing a connection state between devices, comprising:
an output end and an input end connected to respective ends of an interlock loop line included in one of the devices;
a first voltage varying circuit for outputting a first voltage that is variable according to a first current flowing through a first current path from among a current path for transmitting a diagnosis signal to the output end and a current path between the input end and a ground; and
a first impedance varying circuit disposed on the first current path and varying impedance of the first current path according to the first voltage, wherein the first voltage varying circuit and the first impedance varying circuit are operated to maintain the first current at a constant value, wherein the first current path is the current path between the input end and the ground, wherein the connection diagnosis device further includes:
- a second voltage varying circuit for outputting a second voltage that is variable according to a second current flowing to a second current path for transmitting the diagnosis signal to the output end; and
- a second impedance varying circuit disposed on the second current path and varying impedance of the second current path according to the second voltage, wherein the second voltage varying circuit and the second impedance varying circuit are operated so that the second current maintains a constant value, wherein the first voltage varying circuit and the first impedance varying circuit are operated so that the first current maintains a first value, wherein the second voltage varying circuit and the second impedance varying circuit are operated so that the second current maintains a second value, and wherein the first value is different from the second value.

2. The connection diagnosis device of claim 1, wherein the first voltage varying circuit and the first impedance varying circuit are operated so that the first current maintains the first value when the first current belongs to a first current section, the second voltage varying circuit and the second impedance varying circuit are operated so that the second current maintains the second value when the second current belongs to a second current section, and the first current section is different from the second current section.

3. The connection diagnosis device of claim 1, wherein the second voltage varying circuit and the second impedance varying circuit are operated so that the second current maintains the second value while the devices are normally connected.

4. The connection diagnosis device of claim 1, wherein the first voltage varying circuit and the first impedance varying circuit are operated so that the first current maintains the first value while the interlock loop line is short-circuited to a positive electrode side of a battery, and the second voltage varying circuit and the second impedance varying circuit are operated so that the second current maintains the second value while the interlock loop line is short-circuited to the ground.

5. The connection diagnosis device of claim 1, wherein the first voltage varying circuit includes
- a first resistor disposed on the first current path, and
- a first shunt regulator element including an anode terminal and a reference terminal connected to respective ends of the first resistor, and a cathode terminal for outputting the first voltage that is variable according to the first current flowing to the first resistor, and the first impedance varying circuit includes
- a first transistor disposed on the first current path, and including a first terminal connected to the input end, a second terminal connected to the first resistor, and a control terminal connected to a cathode terminal of the first shunt regulator element, and
- a second resistor connected between a node to which the diagnosis signal is input and the control terminal of the first transistor, and impedance of the first transistor is variable according to the first voltage.

6. The connection diagnosis device of claim 5, wherein the second voltage varying circuit includes
- a third resistor disposed on the second current path, and
- a second shunt regulator element including an anode terminal and a reference terminal connected to respective ends of the third resistor, and a cathode terminal for outputting the second voltage that is variable according to the second current flowing to the third resistor, the second impedance varying circuit includes
- a second transistor disposed on the second current path, and including a first terminal connected to the node, a second terminal connected to the third resistor, and a control terminal connected to a cathode terminal of the second shunt regulator element, and
- a fourth resistor connected between the node and the control terminal of the second transistor, and impedance of the second transistor is variable according to the second voltage.

7. The connection diagnosis device of claim 6, wherein resistance of the first resistor is different from resistance of the third resistor.

8. The connection diagnosis device of claim 1, wherein the first voltage varying circuit includes
- a first resistor disposed on the first current path, and a first shunt regulator element including an anode terminal and a reference terminal connected to respective ends of the first resistor and a cathode terminal for outputting the first voltage that is variable according to the first current flowing through the first resistor, the first impedance varying circuit includes
- a first transistor disposed on the first current path and including a first terminal connected to the input end, a second terminal connected to the first resistor, and a control terminal, and
- a second resistor connected between a cathode terminal of the first shunt regulator element and the control terminal of the first transistor, and impedance of the first transistor is variable according to the first voltage.

9. The connection diagnosis device of claim 8, wherein the second voltage varying circuit includes
- a third resistor disposed on the second current path, and
- a second shunt regulator element including an anode terminal and a reference terminal connected to respective ends of the third resistor, and a cathode terminal for outputting the second voltage that is variable according to the second current flowing through the third resistor, the second impedance varying circuit includes
- a second transistor disposed on the second current path, and including a first terminal connected to a node, a second terminal connected to the third resistor, and a control terminal connected to the cathode terminal of the first shunt regulator element and the cathode terminal of the second shunt regulator element, and
- a fourth resistor connected between the node and the control terminal of the second transistor, and impedance of the second transistor is variable according to the first voltage or the second voltage.

10. The connection diagnosis device of claim 9, wherein resistance of the first resistor is different from resistance of the third resistor.

11. The connection diagnosis device of claim 1, further comprising
a passive element disposed on a current path between the input end and the ground, and having fixed impedance.

12. The connection diagnosis device of claim 1, further comprising
a diagnosis unit for diagnosing connection states of the devices and identifying a short-circuit type of the interlock loop line based on at least one of a voltage and a current applied to the interlock loop line through the output end and a voltage and a current received through the input end.

13. A connection diagnosis device for diagnosing a connection state between devices, comprising:
an output end and an input end connected to respective ends of an interlock loop line included in one of the devices;
a first voltage varying circuit for outputting a first voltage that is variable according to a first current flowing through a first current path from among a current path for transmitting a diagnosis signal to the output end and a current path between the input end and a ground; and
a first impedance varying circuit disposed on the first current path and varying impedance of the first current path according to the first voltage,
wherein the first voltage varying circuit and the first impedance varying circuit are operated to maintain the first current at a constant value,
wherein the first current path is the current path between the input end and the ground, and
wherein the connection diagnosis device further includes:
a second voltage varying circuit for outputting a second voltage that is variable according to a second current flowing to a second current path for transmitting the diagnosis signal to the output end, and
a second impedance varying circuit disposed on the second current path, and varying impedance of the second current path according to the first voltage or the second voltage,
wherein the second impedance varying circuit adjusts impedance of the second current path so that the second current maintains a first value according to the first voltage when the second current belongs to a first current section, and it adjusts impedance of the second current path so that the second current maintains a second value according to the second voltage when the second current belongs to a second current section,
wherein the first current section is different from the second current section, and
wherein the first value is different from the second value.

14. The connection diagnosis device of claim 13, wherein
the first impedance varying circuit adjusts impedance of the first current path so that the first current maintains the first value according to the first voltage when the first current belongs to a third current section, and
the first current section is different from the third current section.

15. The connection diagnosis device of claim 13, wherein
the second impedance varying circuit adjusts impedance of the second current path according to the first voltage when the devices are normally connected, and it adjusts impedance of the second current path according to the second voltage when the interlock loop line is short-circuited to the ground.

16. The connection diagnosis device of claim 14, wherein
the first impedance varying circuit maintains a turn-on state when the devices are normally connected, and it adjusts impedance of the first current path according to the first voltage when the interlock loop line is short-circuited to a positive electrode side of a battery.

\* \* \* \* \*